(12) United States Patent
Bolourchi et al.

(10) Patent No.: US 9,698,959 B2
(45) Date of Patent: *Jul. 4, 2017

(54) METHOD AND APPARATUS FOR PROCESSING A DOWNLINK SHARED CHANNEL

(71) Applicant: Intel Corporation, Santa Clara, CA (US)

(72) Inventors: Nader Bolourchi, Elizabeth, NJ (US); Stephen E. Terry, Northport, NJ (US); Stephen G. Dick, Nesconset, NY (US)

(73) Assignee: Intel Corporation, Santa Clara, CA (US)

( * ) Notice: Subject to any disclaimer, the term of this patent is extended or adjusted under 35 U.S.C. 154(b) by 111 days.

This patent is subject to a terminal disclaimer.

(21) Appl. No.: 14/687,858

(22) Filed: Apr. 15, 2015

(65) Prior Publication Data

US 2015/0327219 A1 Nov. 12, 2015

Related U.S. Application Data

(63) Continuation of application No. 14/139,037, filed on Dec. 23, 2013, now Pat. No. 9,026,885, which is a (Continued)

(51) Int. Cl.
*H03M 13/11* (2006.01)
*H04L 5/00* (2006.01)
(Continued)

(52) U.S. Cl.
CPC .......... *H04L 5/0092* (2013.01); *H03M 13/09* (2013.01); *H03M 13/37* (2013.01); *H04L 1/0061* (2013.01); *H04W 72/042* (2013.01)

(58) Field of Classification Search
CPC .................................................. H03M 13/09
(Continued)

(56) References Cited

U.S. PATENT DOCUMENTS 5,142,539 A 8/1992 Dahlin et al.
5,689,563 A 11/1997 Brown et al.
(Continued)

FOREIGN PATENT DOCUMENTS

EP 5142539 8/1992
EP 0532227 3/1993
(Continued)

OTHER PUBLICATIONS

Search Report from Singapore Application No. 201003266-2 mailed Dec. 16, 2011, 7 pages.
(Continued)

*Primary Examiner* — Fritz Alphonse
(74) *Attorney, Agent, or Firm* — Blakely, Sokoloff, Taylor & Zafman LLP

(57) ABSTRACT

A method and apparatus is disclosed in which a user equipment (UE) receives and processes control information received on a first channel. In accordance with a particular embodiment, a use equipment (UI) having a user equipment processor coupled with user equipment circuitry includes means for receiving, via the user equipment circuitry, a wireless signal of a control channel; in which the wireless signal includes both (i) an N bit field and (ii) control information, the N bit field having been generated using the control information and having therein an N bit cyclic redundancy check (CRC) calculated using at least an N bit user equipment identity for the UE; and in which the UE further includes means for determining, via the user equipment circuitry, that the N bit CRC is correct using the N bit user equipment identity; and means for processing, via the user equipment circuitry, the control information upon the user equipment circuitry determining that the N bit CRC is correct.

20 Claims, 4 Drawing Sheets

Related U.S. Application Data continuation of application No. 13/711,501, filed on Dec. 11, 2012, now Pat. No. 8,762,811, which is a continuation of application No. 13/285,831, filed on Oct. 31, 2011, now Pat. No. 8,347,177, which is a continuation of application No. 12/862,561, filed on Aug. 24, 2010, now Pat. No. 8,051,360, which is a continuation of application No. 11/129,850, filed on May 16, 2005, now Pat. No. 7,783,953, which is a continuation of application No. 10/035,771, filed on Dec. 26, 2001, now Pat. No. 6,915,473.

(60) Provisional application No. 60/290,740, filed on May 14, 2001, provisional application No. 60/314,993, filed on Aug. 24, 2001, provisional application No. 60/345,358, filed on Oct. 25, 2001.

(51) Int. Cl.
  *H03M 13/09* (2006.01)
  *H03M 13/37* (2006.01)
  *H04L 1/00* (2006.01)
  *H04W 72/04* (2009.01)

(58) Field of Classification Search
  USPC .................................. 714/758, 745, 708
  See application file for complete search history.

(56) References Cited

U.S. PATENT DOCUMENTS

| | | |
|---|---|---|
| 5,708,710 A | 1/1998 | Duda |
| 5,867,510 A | 2/1999 | Steele |
| 5,912,921 A | 6/1999 | Warren et al. |
| 5,917,840 A | 6/1999 | Cheney et al. |
| 6,031,827 A | 2/2000 | Rikkinen et al. |
| 6,134,605 A | 10/2000 | Hudson et al. |
| 6,201,811 B1 | 3/2001 | Larsson et al. |
| 6,204,687 B1 | 3/2001 | Schultz et al. |
| 6,631,476 B1 | 10/2003 | Vandesteeg et al. |
| 6,694,470 B1 | 2/2004 | Palm |
| 6,816,556 B2 | 11/2004 | Kim |
| 6,850,512 B1 | 2/2005 | Bishop et al. |
| 7,283,502 B1 | 10/2007 | Abraham et al. |
| 7,433,390 B2 | 10/2008 | Helper et al. |
| 7,496,804 B2 | 2/2009 | Juncker |
| 7,593,742 B2 | 9/2009 | Bohnhoff |
| 8,041,335 B2 | 10/2011 | Khetawat et al. |
| 2006/0128309 A1* | 6/2006 | Dateki .................. H04B 7/0613 455/41.3 |
| 2010/0110878 A1* | 5/2010 | Frederiksen .......... H04L 1/1692 370/216 |
| 2013/0128835 A1 | 5/2013 | Bolourchi et al. |

FOREIGN PATENT DOCUMENTS

| | | |
|---|---|---|
| EP | 0564825 | 10/1993 |
| EP | 0681381 | 11/1995 |
| EP | 0987918 | 3/2000 |
| EP | 1065825 A2 | 1/2001 |
| EP | 1298825 | 4/2003 |
| EP | 1341318 | 9/2003 |
| EP | 1594328 | 11/2005 |
| JP | H05-236073 | 9/1993 |
| JP | 08-316967 | 11/1996 |
| JP | H08316967 | 11/1996 |
| JP | 11-203570 | 7/1999 |
| JP | 2004531137 | 10/2004 |
| RU | 2221331 | 1/2004 |
| TW | 421951 | 2/2001 |
| WO | WO-00/21210 | 4/2000 |
| WO | WO-0021210 | 4/2000 |
| WO | WO-00/28763 | 5/2000 |
| WO | WO-0028763 | 5/2000 |
| WO | WO-0030378 | 5/2000 |
| WO | WO-01/01628 | 1/2001 |
| WO | WO-0115390 | 3/2001 |
| WO | WO-02093296 | 11/2002 |

OTHER PUBLICATIONS

Written Opinion from Singapore Application No. 201003266-2 mailed Jun. 8, 2012, 7 pages.
Office Action from European Application No. 10179476.6 mailed Dec. 19, 2012, 7 pages.
Office Action from U.S. Appl. No. 13/711,501 mailed Apr. 1, 2013, 7 pages.
Office Action from European Application No. 10179475.8 mailed Jan. 3, 2013, 8 pages.
Office Action from Japanese Application No. 2011-240111 mailed Apr. 23, 2013, 2 pages.
Motorola, Control Channel Structure for High Speed DSCH (HS-DSCH), TSG R1/R2-12A010021, Apr. 3, 2001.
Nokia, 12A010007, TSG-RAN WG1/WG2 adhoc on HSDPA, 3GPP, Apr. 2001.
Technical Specification Group Radio Access Network; High Speed Downlink Packet Access: Overall UTRAN, May 8, 2001, 3GPP TR 25.855 v0.0.3.
Krishna Balachandran, et al., Design of a Medium Access Control Feedback Mechanism for Cellular TDMA Packet Data Systems, Selected Areas in Communications, IEEE Journal on, Sep. 2000, vol. 18, Issue:9, p. 1719-1730.
Gourgue, F., Air interface of the future European fully digital trunk radio system, Vehicular Technology Conference, 1993., 43rd IEEE, 1993, p. 714-717.
Office Action from Argentinian Application No. P090101379 mailed Jun. 19, 2013, 2 pages.
Office Action from Mexican Application No. MX/a/2010/005664 mailed Jul. 18, 2012, 1 page.
Office Action from Mexican Application No. MX/a/2010/005664 mailed Jun. 21, 2013, 2 pages.
Final Office Action from European Application No. 10179476.6 mailed May 21, 2013, 8 pages.
"Implicit UE Identification for HSDPA Downlink Signaling", XP-002345603, InterDigital Comm. Corp., TSG-RAN Working Group 1 #22, Torino, Italy, Aug. 27-31, 2001, pp. 1-3.
Office Action from Japanese Application No. 2011-183967 mailed Feb. 12, 2013, 2 pages.
Motorola,"Control Channel Structure for High Speed, DSCH (HS-DSCH)," TSGR1/R2-12A010021, Apr. 3, 2001.
Nokia,"DL control channel structures for parameters sent simultaneously with HS-DSCH TTI," 12A010007, TSG-RAN WG1/WG2 adhoc on HSDPA, 3GPP, Apr. 2004.
"3rd Generation Partnership Project; Technical Specification Group Radio Access Network; High Speed Downlink Packet Access: Overall UTRAN (Release 5),"3GPP TR 25.855 v0.0.3, May 8, 2001.
Krishna Balachandran, et al.,"Design of a Medium Access Control Feedback Mechanism for Cellular TDMA Packet Data Systems," IEEE Journal on Selected Areas in Communications, Sep. 2009, vol. 18, Issue:9, pp. 1719-1730.
Office Action from Japanese Application No. 2011-183967 mailed Jun. 11, 2013, 2 pages.
Notice of Allowance from U.S. Appl. No. 13/711,501 mailed Aug. 28, 2013, 19 pages.
Final Office Action from Japanese Application No. 2011-183967 mailed Oct. 1, 2013, 1 page.
Non-Final Office Action for U.S. Appl. No. 12/862,561 mailed Dec. 23, 2010, 7 pages.
Non-Final Office Action for U.S. Appl. No. 13/285,831 mailed Dec. 8, 2011, 6 pages.
Non-Final Office Action for U.S Appl. No. 11/129,850 mailed Dec. 24, 2008, 8 pages.
Final Office Action for U.S. Appl. No. 10/035,771 mailed Dec. 3, 2004, 5 pages.

(56) References Cited

OTHER PUBLICATIONS

Non-Final Office Action for U.S. Appl. No. 10/035,771 mailed Jun. 21, 2004, 12 pages.
Office Action from Japanese Application No. 2011-240111 mailed Oct. 23, 2013, 2 pages.
Office Action from European Application No. 10179475.8 mailed Apr. 10, 2012, 8 pages.
European Search Report for European Application No. 10179476.6 mailed Dec. 23, 2019, 15 pages.
Office Action from European Application No. 10179476.6 mailed Apr. 17, 2013, 7 pages.
Decision to Refuse for European Application No. 10179476.6 mailed Oct. 8, 2013, 13 pages.
Office Action for Chinese Patent Application No. 200710089785.4 mailed Jun. 19, 2009, 8 pages.
Final Office Action for Chinese Patent Application No. 200610136236.3 mailed Feb. 8, 2013, 18 pages.
Office Action for Chinese Patent Application No. 200610136236.3 mailed Oct. 31, 2012, 6 pages.
1st Office Action for Chinese Patent Application No. 200610136236.3 mailed Jul. 3, 2009, 13 pages.
2nd Office Action for Chinese Patent Application No. 200610136236.3 mailed May 17, 2010, 16 pages.
Reexamination for Chinese Patent Application No. 200610136236.3 mailed Apr. 25, 2012, 14 pages.
Final Office Action for Chinese Patent Application No. 200610136236.3 mailed Oct. 8, 2010, 17 pages.
Office Action from Canadian Application No. 2805897 mailed Nov. 15, 2013, 2 pages.
Office Action from Taiwan Application No. 099130764 mailed Dec. 9, 2013, 10 pages.
Dahlman, E., et al. "WCDMA—the radio interface for future mobile multimedia communications," Vehicular Technology, IEEE Transactions on, vol. 47, No. 4, pp. 1105, 1118, Nov. 1998.
P H Dana, "GPS Satellite Signals", http://www.colorado.edu/geography/gcraft/notes/gps/gif/signals.gif, Apr. 1998.
"Navstar GPS User Equipment Introduction", Public Release Version, Sep. 1996.
Chris Rizos., "Chapter 1—Introduction to GPS", University of New South Wales, 1999, pp. 11-15.
"Message Channel Specification, Layers 1-6 for use in Audiovisual Communication", Working Group T/WG 14 Network Aspects (NA), http://www.etsi.org/deliver/cept/34/3402N.PDF, 1989.
Roobol, C. et al., "A proposal for an RLC/MAC protocol for wideband CDMA capable of handling real time and non-real time services," Vehicular Technology Conference, 1998, VTC 98, 48th IEEE, vol. 1, No., pp. 107, 111 vol. 1, May 18-21, 1998.
Office Action from Australian Application No. 2012203588 mailed Feb. 26, 2014, 3 pages.
Office Action from Canadian Application No. 2805897 mailed Jun. 12, 2014, 3 pages.
Second Official Action dated Jul. 7, 2015 (+ English translation), in Japanese Patent Application No. 2014-009473, 6 pages.
InterDigital Comm, Corp., Implicit UE Identification for HSDPA Downlink Signaling [online], 3GPP TSG-RAN WG1#21, R1-01-0810, Internet <URL: http:/http://www.3gpp.org/ftp/tsg_ran/wg1_rl1/TSGR1_21/Docs/Zips/rl-01-0810.zip>, Aug. 22, 2001.
Summons to Attend Oral Proceedings for European Application No. 10179475.8 mailed Mar. 24, 2015, 7 pages.
European Search Report for European Application No. 10179475.8 mailed Dec. 20, 2010, 17 pages.
Balachandran K. et al: "Design of a Medium Access Control Feedback Mechanism for Cellular TDMA Packet Data Systems" IEEE Journal on Selected Areas in Communications, IEEE Inc. New York, US, vol. 18, No. 9, Sep. 2000, pp. 1719-1730.
Interdigital: "Updated Recommendation for UE-specific CRC", TDOC R1-01-1066, 3GPP TSG RAN WG 1 Ad Hoc Meeting on HSDPA, [Online], Nov. 5, 2001, XP002345604, Sophia Antipolis, France, URL:http://www.3gpp.org/ftp/tsg_ran/WG1_RL1/>.
Interdigital Comm. Corp: "Implicit UE Identification for HSDPA Downlink Signaling", TDOC R1-01-0810, 3GPP RAN WG 1 Meeting 22, [Online], Aug. 27, 2001 XP002345603, Torino, Italy, URL:http://www.3gpp.org/ftp/tsg_ran/WG1_RL1/>.
Motorola: "Control Channel Structure for High Speed DSCH (HS-DSCH)", Document 12A1010021 of 3GPP TSG-RAN Working Group 1 and 2 ADHOC, Apr. 6, 2001, pp. 1-5, XP002612555, URL:http://www.3gpp.org/ftp/tsg_ran/WG2_RL2/TSGR2_AHs/2001_04_WG1_HSDPA/.
Gourgue, F. Ed: "Air Interface of the Future European Fully Digital Trunk Radio System", Proceedings of the Vehicular Technology Conference, vol. Conf. 43, May 18, 1993, pp. 714-717.
Office Action for Japanese Patent Application No. 2014-204874 mailed Aug. 11, 2015, 8 pages.
Motorola, Control Channel Structure for High Speed DSCH (HS-DSCH), TSG R1/R2-12A010021, Apr. 3, 2001, URL, http://www.3gpp.org/ftp/tsg_ran/WG2_RL2/TSGR2_AHs/2001_04_WG1_HSDPA/12A010021.zip, 6 pages.
Gourgue, F., Air interface of the future European fully digital trunk radio system, Vehicular Technology Conference, 1993., 43rd IEEE, 1993, p. 714-717, 5 pages.
Krishna Balachandran, et al., Design of a Medium Access Control Feedback Mechanism for Cellular TDMA Packet Data Systems, Selected Areas in Communications, IEEE Journal on, Sep. 2000, vol. 18, Issue: 9, p. 1719-1730, 13 pages.
Golden Bridge Technology, CPCH Parameters for L1 Primitives [online], 3GPP TSG-RAN WG2#09 R2-99H84, Internet <URL: http://www.3gpp.org/ftp/tsg_ran/WG2_RL2/TSGR2_09/Docs/Zips/R2-99H84.zip>, Nov. 30, 1999, 9 pages.
Notice of Intention to Grant for European Application No. 10179475.8 mailed Nov. 25, 2015, 7 pages.
Motorola, Control Channel Structure for High Speed DSCH (HS-DSCH), TSG R1/R2-12A010021, Apr. 3, 2001, URL, http://www.3gpp.org/ftp/tsg_ran/WG2_RL2/TSGR2_AHs/2001_04_WG1_HSDPA/12A10021.zip.
First Official Action dated Nov. 6, 2014 (+ English translation), in Japanese Patent Application No. 2014-009473, 5 pages.
Notice of Allowance mailed Jan. 14, 2015, in U.S. Appl. No. 14/139,037, 9 pages.
Office Action dated Aug. 5, 2014 (+ English translation), in Taiwan Patent Application No. 100107989, 6 pages.
Office Action mailed Jul. 30, 2014, in U.S. Appl. No. 14/139,037, 6 pages.
Office Action mailed Jun. 10, 2014 (+ English translation), in Japanese Patent Application No. 2011-240111, 3 pages.

* cited by examiner

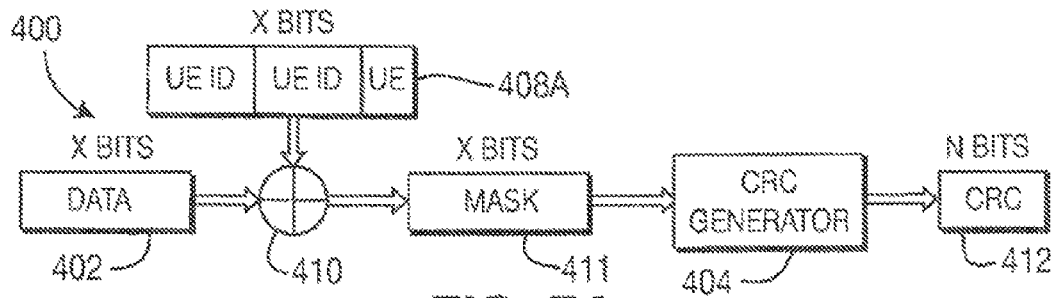
*FIG. 7A*
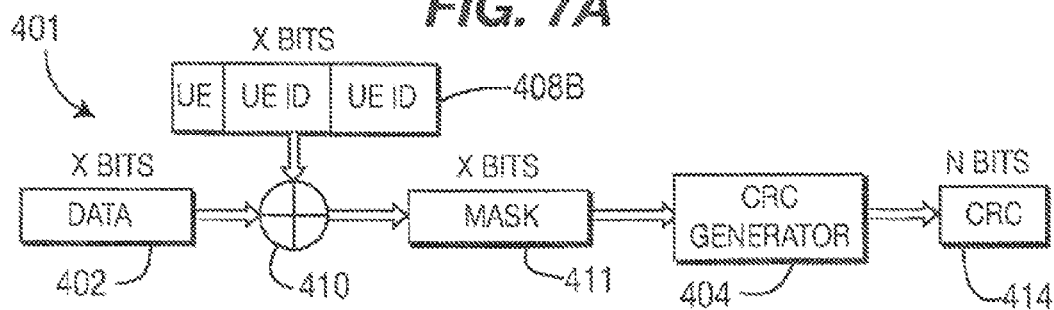
*FIG. 7B*
*FIG. 7C*
| GLOBAL ID | | | | | | ALTERNATE GROUP IDs |
|---|---|---|---|---|---|---|
| SUBSET 1 ID | | SUBSET 2 ID | | SUBSET 3 ID | | |
| SUBSUBSET A ID | SUBSUBSET B ID | SUBSUBSET C ID | SUBSUBSET D ID | SUBSUBSET E ID | SUBSUBSET F ID | |
| UE #1 | UE #6 | UE #11 | UE #16 | UE #21 | UE #26 | GROUP A |
| UE #2 | UE #7 | UE #12 | UE #17 | UE #22 | UE #27 | GROUP B |
| UE #3 | UE #8 | UE #13 | UE #18 | UE #23 | UE #28 | GROUP C |
| UE #4 | UE #9 | UE #14 | UE #19 | UE #24 | UE #29 | GROUP D |
| UE #5 | UE #10 | UE #15 | UE #20 | UE #25 | UE #30 | GROUP E |
*FIG. 8*
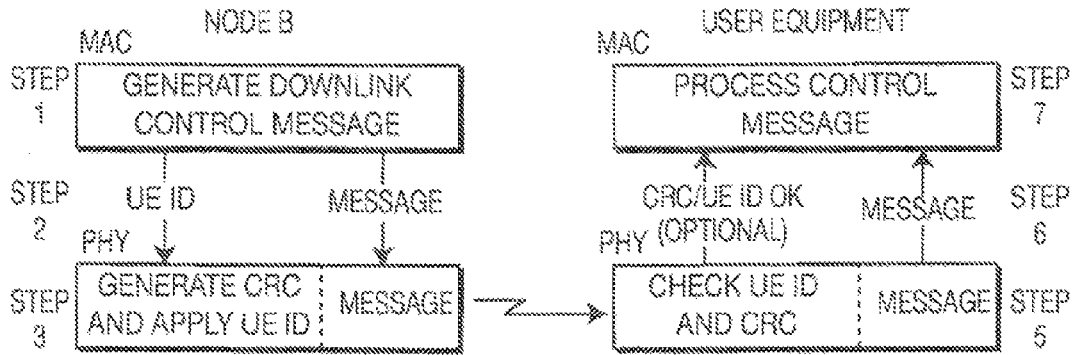
*FIG. 9*

METHOD AND APPARATUS FOR PROCESSING A DOWNLINK SHARED CHANNEL

CROSS REFERENCE TO RELATED APPLICATIONS

This application is a continuation of U.S. patent application Ser. No. 14/139,037 filed Dec. 23, 2013, which claims priority to and is a continuation of U.S. patent application Ser. No. 13/711,501 filed Dec. 11, 2012, which issued as U.S. Pat. No. 8,762,811 on Jun. 24, 2014, which is a continuation of U.S. patent application Ser. No. 13/285,831 filed Oct. 31, 2011, which issued as U.S. Pat. No. 8,347,177 on Jan. 1, 2013, which is a continuation of U.S. patent application Ser. No. 12/862,561, filed Aug. 24, 2010, which issued as U.S. Pat. No. 8,051,360 on Nov. 1, 2011, which is a continuation of U.S. patent application Ser. No. 11/129,850, filed May 16, 2005, which issued as U.S. Pat. No. 7,783,953 on Aug. 24, 2010, which is a continuation of U.S. patent application Ser. No. 10/035,771, filed Dec. 26, 2001, which issued as U.S. Pat. No. 6,915,473 on Jul. 5, 2005, which claims the benefit of U.S. Provisional Patent Application Nos. 60/290,740, filed May 14, 2001; 60/314,993, filed Aug. 24, 2001; and 60/345,358, filed Oct. 25, 2001, which are incorporated by reference as if fully set forth herein.

BACKGROUND

The present invention relates to the field of wireless communications. One of the applications of the present invention is directed to a downlink signaling approach employing a modified cyclic redundancy check for both data protection and unique/group UE identification.

Wireless communication systems have become an integral link in today's modern telecommunications infrastructure. As such, they have become increasingly relied upon not only to support voice communications, but also data communications. Voice communications are relatively low-rate, symmetrical in the upstream and downstream bandwidths and are predictable in the amount of bandwidth required.

However, data communications can place severe burdens upon a telecommunications system, particularly a wireless telecommunication system. First, data communications can often require extremely high data rates. Second, the amount of bandwidth for a data related application can vary greatly from several kilohertz of bandwidth to several megahertz. Third, the amount of bandwidth in the upstream and downstream directions can be drastically different. For example, with a typical Internet browsing application, very little data is sent in the upstream direction while vast amounts of data are downloaded in the downstream direction. These factors can place severe constraints upon a wireless telecommunication system.

The Wideband CDMA (WCDMA) standard, as the leading global third generation (3G) (IMT-2000) standard, supports data rates up to 2 Mb/s in indoor/small-cell-outdoor environments and up to 384 kb/switch wide-area coverage, as well as support for both high-rate packet data and high-rate circuit-switched data. However to satisfy the future demands for packet-data services, there is a need for substantial increase in this data rate, especially in the downlink. High speed downlink packet access (HSDPA) would allow WCDMA to support downlink peak data rates in the range of approximately 8-10 Mb/s for best-effort packet-data services. This rate is far beyond the IMT-2000 requirement of 2 Mb/s. It also enhances the packet-data capability in terms of lower delay and improved capacity.

One solution for supporting data communications is the allocation of dedicated channels to each user equipment (UE). However, this results in an extremely inefficient use of the bandwidth since such channels often remain idle for long durations.

An alternative to dedicated channels for each UE is the use of the high speed shared data channels and the packeting of data. In this method, a plurality of high speed data channels are shared between a plurality of UEs. Those UEs having data for transmission or reception are dynamically assigned one of the shared data channels. This results in a much more efficient use of the spectrum.

One such process for assigning a high speed shared data channel when a base station has data waiting for transmission to a particular UE is shown in FIGS. 1A-1C. Referring to FIG. 1A, an associated downlink dedicated physical channel (DPCH) is transmitted to each UE. The UE monitors associated downlink DPCH as well as the shared control channels (SCCH-HS). When there is no data being transmitted to the UE from the base station, the UE enters a standby mode whereby it periodically "wakes up" to attempt to monitor its associated downlink DPCH as well as SCCH-HSs. This permits the UE to save processing and battery resources.

If data at the base station is ready for transmission to the UE, a High Speed Downlink Shared Channel (HS-DSCH) indicator (HI) is transmitted in the associated DPCH. The HI has n-bit length, which points to one of $2^n$ SCCH-HSs shown in FIG. 1B. For example a 2 bit HI can point to 4 SCCH-HSs, i.e., 00, 01, 10 or 11.

For the example shown in FIG. 1A, the HI is (1,0) which points to the third channel shown in FIG. 1B. When the UE accesses the control channel identified by the HI, that particular SCCH-HS will direct the UE to the proper HS-DSCH, which has been allocated to the UE for reception of the data. As shown in FIG. 1C, for example, the UE tunes to HS-DSCH (001) that was identified by SCCH-HS (1,0). The UE then receives the data intended for it over the HS-DSCH (001). It should be noted that the graphical representation of FIGS. 1A-1C has been presented to illustrate the process of assigning HS-DSCHs, and the configuration and use of channels may differ slightly from actual implementation in HSDPA standards.

The process as described with reference to FIGS. 1A-1C provides an efficient method for assigning common data channels for transmission of data. Since packet data is intended for one or more, specific UEs, the UE identity (ID) is a critical parameter for signaling from the base station to the UE.

There are several prior art methods for signaling the UE ID between the base station and the UE. Referring to FIG. 2A, the first method appends the UE ID onto the data for transmission. The combination is led to a cyclic redundancy check (CRC) generator, which outputs a CRC. The resulting data packet, which is ultimately transmitted, includes an X-bit data field, an M-bit UE ID and an N-bit CRC as shown in FIG. 2B. Although this provides adequate signaling of both the CRC and the UE ID, it is wasteful of signaling bandwidth.

Another prior art technique shown in FIG. 3A appends the UE ID onto the data field for input into the CRC generator. The CRC generator outputs a CRC. As shown in FIG. 3B, the data burst for transmission includes an X-bit data field and an N-bit CRC field. Although this also adequately signals the UE ID and the CRC between the base station and the UE, it is undesirable since it can only be used for unique UE identification. This method also causes increased complexity of the UE when a grasp of UEs need to be identified.

SUMMARY

A method and apparatus is disclosed wherein a user equipment (UE) receives control information on a first channel and uses the control information to process a second channel.

BRIEF DESCRIPTION OF THE DRAWINGS

FIG. 1A illustrates the associated downlink channel, FIG. 1B illustrates a plurality of control channels and FIG. 1C illustrates a plurality of data channels.

FIG. 7A is a fifth embodiment of the present invention which modulo 2 adds the data field to a UE ID field repeated and padded a truncated UE ID in the trailing bits.

FIG. 7B is a sixth embodiment of the present indention which modulo 2 adds the data field to a UE ID field repeated and padded a truncated UE ID in the leading bits.

FIG. 7C is the data burst transmitted by the embodiments of FIGS. 7A and 7B including a data field and a CRC field.

FIG. 8 is a tabulation of global, subset, subsubset and unique IDs.

FIG. 9 is a flow diagram of the processing of a message in accordance with the present invention.

DETAILED DESCRIPTION OF THE PREFERRED EMBODIMENTS

Figure 1A:
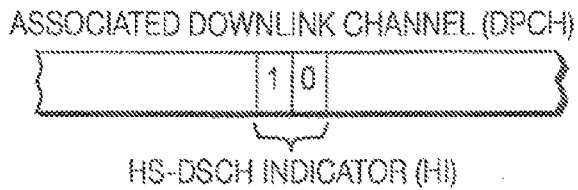
FIGS. 1A-1C represent a prior art method for assigning shared data channels, where
Figure 1B:
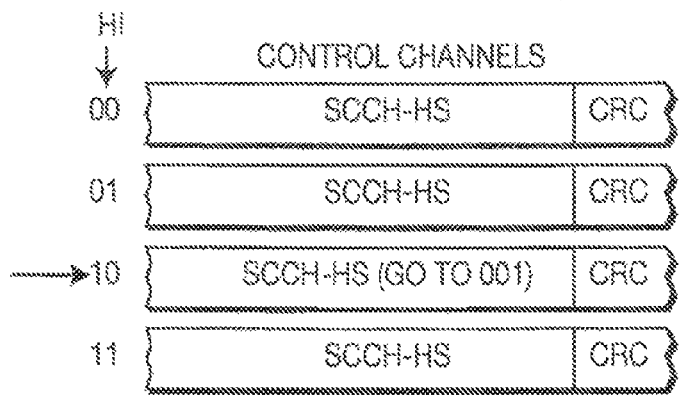
Figure 1C:
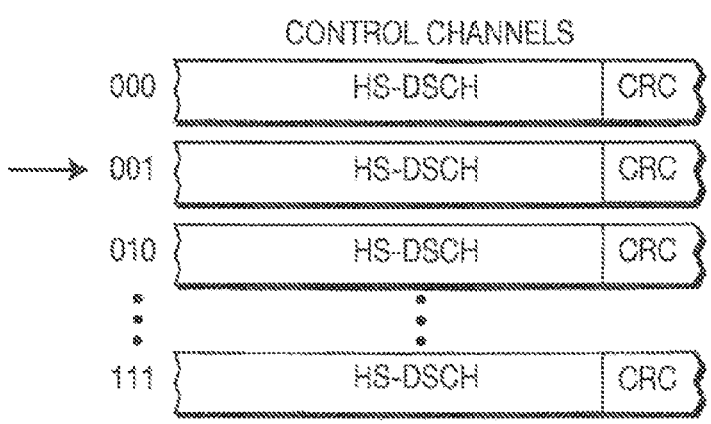

The presently preferred embodiments are described below with reference to the drawing figures wherein like numerals represent like elements throughout.

Figure 1D:
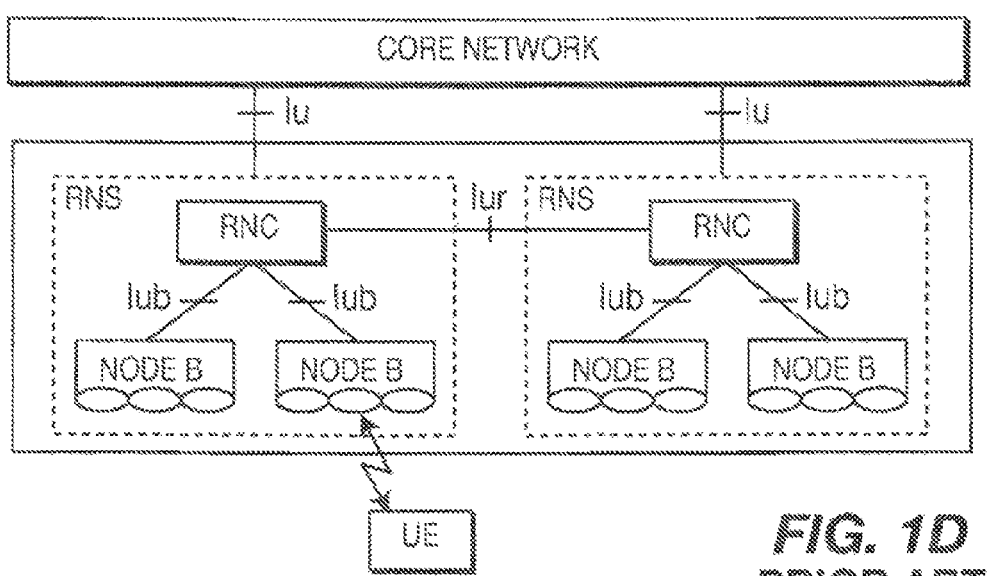
FIG. 1D is a block diagram of the universal mobile telecommunication system network architecture.
Figure 2A:
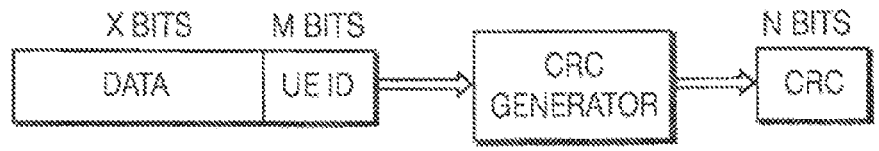
FIG. 2A is a prior art user equipment identification (UE ID) specific cyclic redundancy check (CRC) method.
Figure 2B:
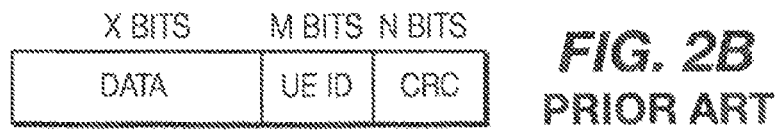
FIG. 2B illustrates the transmitted data burst including a data field, a UE ID field and a CRC field.

Referring to FIG. 1D, a Universal Mobile Telecommunications System (UMTS) network architecture used by the present invention includes a core network (CN), a UMTS Terrestrial Radio Access Network (UTRAN), and a User Equipment (UE). The two general interfaces are the Iu interface, between the UTRAN and the core network, as well as the radio interface Uu, between the UTRAN and the UE. The UTRAN consists of several Radio Network Subsystems (RNS). They can be interconnected by the Iur interface. This interconnection allows core network independent procedures between the different RNSs. The RNS is further divided into the Radio Network Controller (RNC) and several base stations (Node-B). The Node-Bs are connected to the RNC by the Iub interface. One Node-B can serve one or more multiple cells, and typically serves a plurality of UEs. The UTRAN supports both FDD mode and TDD mode on the radio interface. For both modes, the same network architecture and the same protocols are used. Only the physical layer and the air interface Uu are specified separately.

Figure 4A:
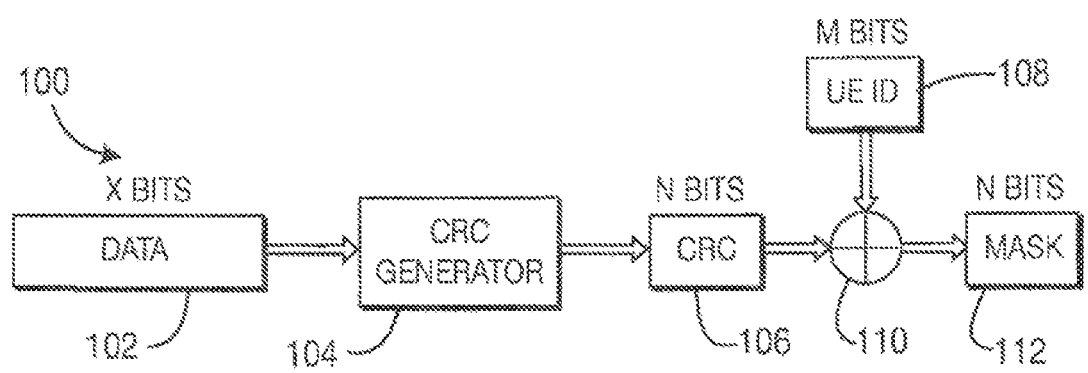
FIG. 4A is a first embodiment of the present invention utilizing modulo 2 addition of the UE ID with the CRC to create a mask.

Referring to FIG. 4A, one embodiment of the present invention is shown. In this embodiment, the system 100 utilizes the data for transmission (hereinafter referred to as "data") from the data field 102, a CRC generator 104 (which has been initialized to zero), the resulting CRC from the CRC field 106 output from the CRC generator 104, the UE ID from the UE ID field 108, a modulo 2 adder 110 and a mask 112. It should be noted that in this embodiment and all of the embodiments described hereinafter, the number of bits of each field is noted above the field as an example. However, the specific number of bits is exemplary and should not be construed to limit the present invention.

The system 100 receives the data field 102 and inputs the data from the data field 102 into the CRC generator 104. The CRC generator 104 generates the CRC field 106 and outputs the CRC from the CRC field 106 to a first input of the modulo 2 adder 110. The UE ID from the UE ID field 108 is output to the second input to the modulo 2 adder 110. The CRC and UE ID are then modulo 2 added to create a mask 112.

Preferably, the number of bits of the UE ID field 108 (M bits) is the same as the number of bits of the CRC field 106 (N bits). If M=N, then the UE ID may be directly modulo 2 added to the CRC as shown in FIG. 4A. However, if M and N are not equal, then an interim step is necessary to make them equal. If M<N, then the UE ID is padded with either leading zeros or trailing zeros to be equal in length to the CRC. This "padded UE ID" is N modulo 2 added to the CRC 106. If M>N, then the least significant M-N bits are truncated from the UE ID. The truncated UE ID is then modulo 2 added to the CRC.

Figure 4B:
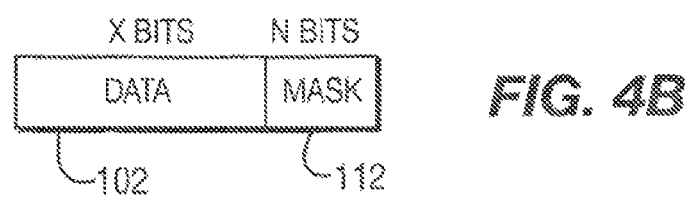
FIG. 4B is a data burst transmitted by the system of FIG. 4A including a data field and a mask field.

Referring to FIG. 4B, the mask 112 that is generated is appended to the data field 102 for transmission.

Figure 5A:
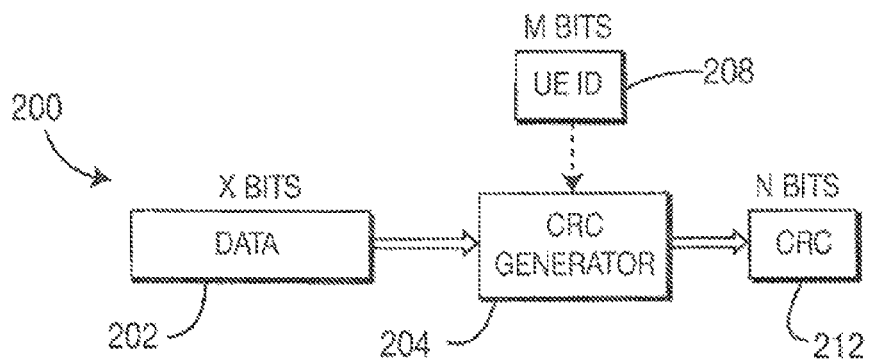
FIG. 5A is a second embodiment of the present invention including a CRC generator which is initialized using the UE ID.

Referring to FIG. 5A, a second embodiment of the present invention is shown. In this embodiment, the system 200 utilizes the data from the data field 202, a CRC generator 204, the UE ID from the UE ID field 208, and the resulting CRC field 212. The system 200 receives the data field 202 and outputs the data from data field 202 into the CRC generator 204. The CRC generator 204 is the same type of generator as the CRC generator 104 from FIG. 4A, except that the CRC generator 204 is initialized with the UE ID from the UE ID field 208. This initialization is illustrated by the dotted line in FIG. 5A. As is well known by those of skill in the art, a CRC generator is typically initialized to all zeros, as was the case with the CRC generator 104 shown in FIG. 4A. Accordingly, the CRC generator 204 generates a CRC based upon the input data from the data field 202 and the initialization of the CRC generator 204 with UE ID. No modulo 2 addition is required in this embodiment.

Preferably, the number of bits of the UE ID from the UE ID field 208 (M bits) is the same as the size of the CRC generator 204, although this is not necessary. If the size of the UE ID (M-bits) is less than the size of the CRC generator 204, then the UE ID may be padded with either leading zeros or trailing zeros to be equal in length to the size of the CRC generator 204. This "padded UE ID" may then be used to initialize the CRC generator 204. Alternatively, the value in the UE ID field 208 may be loaded to initialize the CRC generator 204, and any bit positions not filled by the UE ID would be zero. If the size of the UE ID (M bits) is greater than the size of the CRC generator 204, then the least significant bits are truncated from the UE ID in order to fit the UE ID to CRC generator 204. The truncated UE ID is then used to initialize the CRC generator 204.

Figure 5B:
FIG. 5B is a data burst transmitted by the embodiment of FIG. 5A including a data field and a CRC field.

Referring to FIG. 5B, the CRC field 212 that is generated is appended to the data field 202 for transmission.

This second embodiment of the present invention utilizing implicit UE ID presents a simplistic, yet robust, alternative since it does not require assembly and disassembly of the UE ID with the SCCH-HS, at the transmitter or the receiver, as required by UE-specific CRC methods of the prior art and the first embodiment.

Referring to FIG. 7A, a fifth embodiment of the present invention is shown. In this embodiment, the system 400 utilizes the data from the data field 402, the UE ID from the UE ID field 408A, a modulo 2 adder 410, a mask 411, a CRC generator 404 and the resulting CRC field 412. The system 400 receives the data filed 402 and inputs the data from the data field 402 into a first input of the modulo 2 adder 410. The UE ID from UE ID field 408A is output to the second input to the modulo 2 adder 410. The data from the data field 402 and the UE ID from the UE ID field 408A are modulo 2 added to create a mask 411. The mask 411 is input into the CRC generator 404, which generates the CRC field 412.

In this embodiment, the number of bits of the UE ID field 408A (M bits) must be the same as the number of bits of the data field 402 in order to perform the modulo 2 addition. If the M is equal to X, then the UE ID from the UE ID field 408A may be directly modulo 2 added to the data from the data field 402. Due to the length of the data field 402, it is not expected that M will be greater than X. However, if this were to occur, then the least significant bits are truncated from the UE ID field 408A until the length of the UE ID field is equal to X. The truncated UE ID is then modulo 2 added to the value from the data field 402.

Due to the length X of the data field 302, it is not expected that M will be greater than X. However, if this were to occur, then the least significant M-X bits are truncated from the value in UE ID field 308A. The truncated UE ID is then modulo 2 added to the data from the data field 302.

Figure 6A:
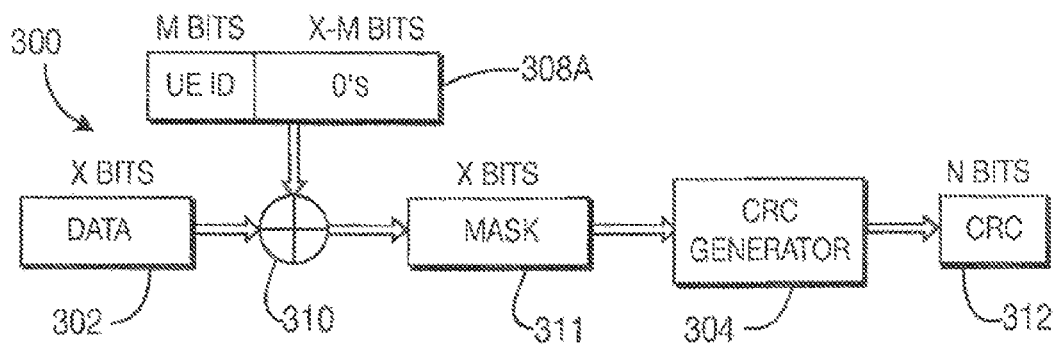
FIG. 6A is a third embodiment of the present invention which modulo 2 adds the data field to a UE ID field padded with trailing zeros to create a mask.
Figure 6B:
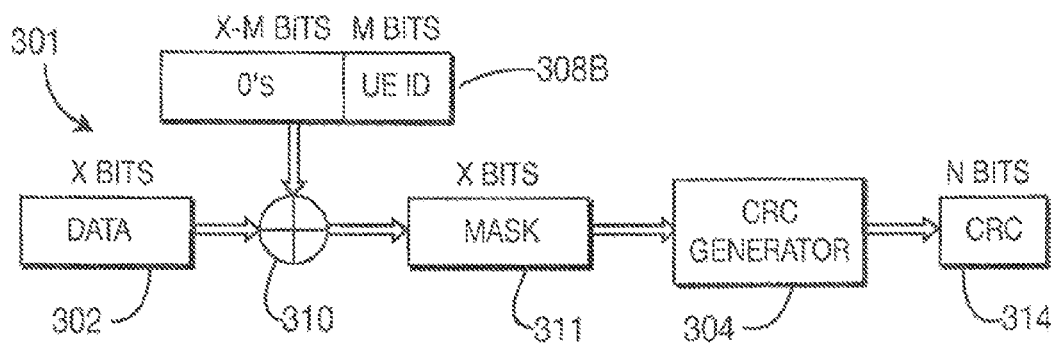
FIG. 6B is a fourth embodiment of the present invention which modulo 2 adds the data field to a UE ID field padded with leading zeros to create a mask.
Figure 6C:
FIG. 6C is the data burst transmitted by the embodiments of FIGS. 6A and 6B including a data field and a CRC field.

Referring to FIG. 6B, a fourth embodiment of the present invention is shown. In this embodiment, the system 301 operates in the exact same manner as the third embodiment shown in FIG. 6A. The only difference in this embodiment is the method in which the value from the UE ID field 308B is generated. In this embodiment, the UE ID is padded with X-M leading zeros such that the UE ID from the UE ID field 308B is equal in length to the data field 302. This "padded UE ID value", as shown in FIG. 6B, is then modulo 2 added to the data from the data field 302. It should be noted that the padding may alternatively comprise a combination of leading and trailing zeros (not shown) in order to make the UE ID the same length as the data field.

Figure 3A:
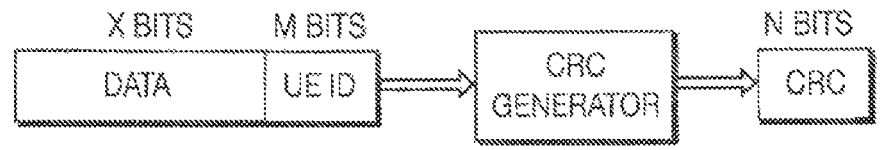
FIG. 3A is a second prior art user equipment identification (UE ID) specific cyclic redundancy check (CRC) method.
Figure 3B:
FIG. 3B illustrates the transmitted data burst including a data field and a CRC field.

Referring to FIG. 3C, the CRC field 312 that is generated from the system 300 of the third embodiment shown in FIG. 6A, or the CRC 314 that is generated from the system 301 of the fourth embodiment shown in FIG. 6B, is appended to the data field 302 for transmission. Accordingly, either type of CRC field 312, 314 may be used and appended onto the data field 302.

Referring to FIG. 7A, a fifth embodiment of the present invention is shown. In this embodiment, the system 400 utilizes the data from the data field 402, the UE ID from the UE ID field 408A, a modulo 2 adder 410, a mask 411, a CRC generator 404 and the resulting CRC field 412. The system 400 receives the data field 402 and inputs the data from the data field 302 into a first input of the modulo 2 adder 410. The UE ID from UE ID field 408A is output to the second input to the modulo 2 adder 410. The data from the data field 402 and the UE ID from the UE ID field 408A are modulo 2 added to create a mask 411. The mask 411 is input into the CRC generator 404, which generates the CRC field 412.

In this embodiment, the number of bits of the UE ID field 408A (M bits) must be the same as the number of bits of the data field 402 in order to perform the modulo 2 addition. If the M is equal to X, then the UE ID from the UE ID field 408A may be directly modulo 2 added to the data from the data field 402. Due to the length of the data field 302, it is not expected that M will be greater than X. However, if this were to occur, then the least significant bits are truncated from the UE ID field 408A until the length of the UE ID field is equal to X. The truncated UE ID is then modulo 2 added to the value from the data field 402.

If the length of the UE ID is shorter than the data field 402, than a "composite UE ID" is created such that the value from the UE ID field 408A is equal to X. The composite UE ID is created by repeating the UE ID as many times as it will fit within an X-bit field, then filling in the remaining trailing bits with a truncated UE ID. This is represented in the UE ID field 408A in FIG. 7A. The composite UE ID is then modulo 2 added to the data from the data field 402.

Referring to FIG. 7B, a sixth embodiment of the present invention is shown. The system 401 of this embodiment operates in the same manner as the fifth embodiment shown in FIG. 7A. The only difference in this embodiment is the value from the UE ID field 408B. Although the composite UE ID created in the same manner as in FIG. 7A, the truncated UE ID portion is added as leading bits, as opposed to the trailing bits in the UE ID field 408A shown in FIG. 7A. It should be noted that the truncated UE ID "padding" may include a combination of leading and trailing truncated bits in order to make the UE ID the same length as the data field 402.

Referring to FIG. 7C, the CRC field 412 that is generated from either the system 400 of the fifth embodiment shown in FIG. 7A, or the CRC field 414 that is generated from the system 401 of the sixth embodiment shown in FIG. 7B, is appended to the data field 402 for transmission. Accordingly, either type of CRC field 412, 414 may be used and appended onto the data field 402.

It should be noted that all of the above-described embodiments can be used to support multiple identities (IDs). A UE may be required to process messages addressed at several levels: 1) the UE's unique ID, 2) an ID corresponding to a subset or group of UEs, where the UE belongs to the subset; or 3) a broadcast (global ID) corresponding to all UEs in the system. For example, as shown in FIG. 8, UE ID 12 has been highlighted to indicate that it will able to receive and process IDs at four different levels: 1) the UE-specific ID (#12); 2) subsubset C ID; 3) subset 2 ID; and 4) global ID. It should also be noted that alternate group identifications A-E, may also be created such that a different group of UEs may be included. For example, group B will include all of the UEs identified next to group B which include UE numbers 2, 7, 12, 17, 22 and 27. Additionally, any group or subgroup may be created by specifically identifying individual UEs as desired by a user.

To support this requirement, the transmitter generates the CRC as described above with each of the embodiments. At the receiver, the UE processes the message and generates the expected CRC, without the ID-based modification. The UE processor then modulo 2 adds the received CRC to the calculated CRC. The resultant output is the transmitted ID, which can be any one of the IDs described above. If the ID is none of these, then the UE discards the transmission.

In accordance with the present invention, using the CRC code of the length N, the undetected error probability on the identified SCCH-HS approaches $2^{-n}$. Using a 24-bit CRC to protect data transmitted on HS-DSCH, a 16-bit CRC to protect control information transmitted on SCCH-HS, and assuming $10^{-3}$ false acceptance probability for HI bits by an unintended UE, the embodiments in accordance with the present invention hereinbefore described will provide the probability of the false acceptances as follows:

$$P_{fa}=P_{fa}HI \times P_{fa}H \times P_{SD} \qquad \text{Equation (1)}$$

$P_{fa}$ is the probability of a false acceptance; $P_{fa}HI$ is the probability of a false acceptance of HI; $P_{fa}H$ is the probability of a false acceptance of SCCH-HS; and $P_{SD}$ is the probability of a successful detection of HS-DSCH ($P_{SD}$).

Using the above identified values for the present example with Equation (1):

$$P_{fa}=10^{-3} \times 2^{-16} \times 2^{-24} = 9.1 \times 10^{-16}$$

The reliability computation indicates that for the same length CRC, the probability of a user passing erroneous data up to a higher layer, will be extremely low.

Referring to FIG. 9, the flow diagram illustrates a method for processing downlink messages between a node B and a UE in accordance with the present invention. This method provides a general overview and should not be interpreted as a comprehensive description of all the detailed medium access control (MAC) layer and physical layer signaling required for processing a message, (i.e., a data packet). The node B first generates a downlink control message in the MAC layer (step 1) and then forwards the message and the UE ID to the physical layer (step 2). The physical layer generates the CRC and applies the UE ID for forwarding with the message (step 3) as a data burst. The message is then transmitted from the node B to the UE (step 4). At the physical layer, the UE ID and the CRC are checked to determine if they are correct (step 5). If so, the message is forwarded to the MAC layer (step 6) which then further processes the message (step 7).

It should be noted that step 6 in FIG. 9 includes an additional signal between the physical layer and the MAC layer, which comprises a control message that indicates the CRC/UE ID is valid. However, this is an optional step. In the preferred embodiment, only valid messages will be forwarded from the physical layer to the MAC layer. Accordingly, in the preferred embodiment, the MAC layer will assume that any message that is forwarded to the MAC is valid. In the alternative embodiment, the additional CRC/UE ID valid signaling will be forwarded along with the message as an additional confirmation.

The present invention has the advantage of eliminating separate processing steps for the UE ID and the CRC. When the two fields are combined as hereinbefore described, the UE will not further process any message until both the CRC and the UE ID (or other type of ID shown in FIG. 8) are correct.

While the present invention has been described in terms of the preferred embodiment, other variations, which are within the scope of the invention, as outlined in the claims below will be apparent to those skilled in the art.

What is claimed is:

1. A user equipment (UE) comprising:
   a user equipment processor coupled with user equipment circuitry;
   the user equipment circuitry configured to receive a wireless signal of a control channel;
   wherein the wireless signal comprises both (i) an N bit field and (ii) control information, the N bit field having been generated using the control information and having therein an N bit cyclic redundancy check (CRC) calculated using at least an N bit user equipment identity for the UE;
   the user equipment circuitry configured to determine the N bit CRC is correct using the N bit user equipment identity; and
   the user equipment circuitry configured to process the control information upon the user equipment circuitry determination that the N bit CRC is correct.

2. The user equipment (UE) of claim 1:
   wherein the user equipment circuitry configured to process the control information comprises the user equipment circuitry configured to process a High Speed-Physical Downlink Shared Control Channel (HS-SCCH) or a High Speed (HS) Downlink Shared Channel (DSCH) using the control information.

3. The user equipment (UE) of claim 1:
   wherein the user equipment circuitry configured to process the control information comprises the user equipment circuitry being adapted to provide the control information from a physical layer of the UE to a Medium Access Control (MAC) layer of the UE.

4. The user equipment (UE) of claim 1:
   wherein the user equipment circuitry configured to receive a wireless signal of the control channel comprises the user equipment circuitry configured to receive a wireless signal through a physical downlink control channel.

5. The user equipment (UE) of claim 1:
   wherein the user equipment circuitry configured to receive the wireless signal of the control channel comprises the user equipment circuitry configured to receive the wireless signal through a high speed (HS) shared control channel (SCCH).

6. The user equipment (UE) of claim 1:
   wherein the N bit cyclic redundancy check (CRC) is calculated using at least the N bit user equipment identity for the user equipment and using an entirety of a payload of the wireless signal via which the control information is received.

7. The user equipment (UE) of claim 1:
   wherein the N bit user equipment identity for the user equipment is associated with a group of user equipments operating in a wireless network common to the user equipment or alternatively in which the N bit user equipment identity for the user equipment is uniquely identifies the user equipment within the wireless network within which the user equipment operates.

8. The user equipment (UE) of claim 1:
wherein the user equipment circuitry to receive the wireless signal of the control channel comprises the user equipment circuitry being adapted to receive Downlink Control Information (DCI) and masked Cyclic Redundancy Check (CRC) bits via the wireless signal of the control channel; and
wherein the N bit cyclic redundancy check (CRC) is calculated using at least the DCI and scrambled using at least the N bit user equipment identity for the user equipment.

9. The user equipment (UE) of claim 1:
wherein the user equipment circuitry is further adapted to discard control information associated with an N bit cyclic redundancy check (CRC) determined by the user equipment circuitry to be not correct.

10. The user equipment (UE) of claim 1:
wherein the N bit cyclic redundancy check (CRC) comprises an N bit modulo two type cyclic redundancy check (CRC).

11. A method performed by a user equipment processor coupled with user equipment circuitry, the method comprising:
receiving, via the user equipment circuitry, a wireless signal of a control channel;
wherein the wireless signal comprises both (i) an N bit field and (ii) control information, the N bit field having been generated using the control information and having therein an N bit cyclic redundancy check (CRC) calculated using at least an N bit user equipment identity for the UE;
determining, via the user equipment circuitry, that the N bit CRC is correct using the N bit user equipment identity; and
processing, via the user equipment circuitry, the control information upon the user equipment circuitry determining that the N bit CRC is correct.

12. The method of claim 11:
wherein processing the control information comprises processing a High Speed-Physical Downlink Shared Control Channel (HS-SCCH) or a High Speed (HS) Downlink Shared Channel (DSCH) using the control information.

13. The method of claim 11:
wherein processing the control information comprises providing, via the user equipment circuitry, the control information from a physical layer of the UE to a Medium Access Control (MAC) layer of the UE.

14. The method of claim 11:
wherein receiving the wireless signal of the control channel comprises receiving the wireless signal through a physical downlink control channel.

15. The method of claim 11:
wherein receiving the wireless signal of the control channel comprises receiving the wireless signal through a high speed (HS) shared control channel (SCCH).

16. The method of claim 11, further comprising:
calculating the N bit cyclic redundancy check (CRC) using at least the N bit user equipment identity for the user equipment and using an entirety of a payload of the wireless signal via which the control information is received.

17. The method of claim 11:
wherein the N bit user equipment identity for the user equipment is associated with a group of user equipments operating in a wireless network common to the user equipment or alternatively in which the N bit user equipment identity for the user equipment is uniquely identifies the user equipment within the wireless network within which the user equipment operates.

18. The method of claim 11:
wherein receiving the wireless signal of the control channel comprises receiving Downlink Control Information (DCI) and masked Cyclic Redundancy Check (CRC) bits via the wireless signal of the control channel; and
wherein the method further comprises calculating the N bit cyclic redundancy check (CRC) using at least the DCI and scrambling the N bit cyclic redundancy check (CRC) using at least the N bit user equipment identity for the user equipment.

19. The method of claim 11, further comprising:
discarding, via the user equipment circuitry, control information associated with an N bit cyclic redundancy check (CRC) determined by the user equipment circuitry to be not correct.

20. The method of claim 11:
wherein the N bit cyclic redundancy check (CRC) comprises an N bit modulo two type cyclic redundancy check (CRC).

* * * * *